(12) United States Patent
Zhang et al.

(10) Patent No.: US 8,889,030 B2
(45) Date of Patent: Nov. 18, 2014

(54) PB(HF,TI)O$_3$ BASED HIGH PERFORMANCE POLYCRYSTALLINE PIEZOELECTRIC MATERIALS

(71) Applicant: The Pennsylvania State University, University Park, PA (US)

(72) Inventors: Shujun Zhang, State College, PA (US); Dawei Wang, State College, PA (US); Mingfu Zhang, State College, PA (US); Shiyi Guo, State College, PA (US); Thomas R. Shrout, Furnace, PA (US)

(73) Assignee: The Penn State Research Foundation, University Park, PA (US)

( * ) Notice: Subject to any disclaimer, the term of this patent is extended or adjusted under 35 U.S.C. 154(b) by 90 days.

(21) Appl. No.: 13/629,205

(22) Filed: Sep. 27, 2012

(65) Prior Publication Data

US 2013/0168596 A1    Jul. 4, 2013

Related U.S. Application Data

(60) Provisional application No. 61/581,365, filed on Dec. 29, 2011.

(51) Int. Cl.
*C04B 35/49* (2006.01)
*H01L 41/187* (2006.01)

(52) U.S. Cl.
USPC ............... 252/62.9 PZ; 252/62.9 R; 501/136

(58) Field of Classification Search
USPC ................. 252/62.9 R, 62.9 PZ; 501/136
See application file for complete search history.

(56) References Cited

U.S. PATENT DOCUMENTS

2011/0017937 A1    1/2011 Luo et al.

*Primary Examiner* — Carol M Koslow
(74) *Attorney, Agent, or Firm* — Gifford, Krass, Sprinkle, Anderson & Citkowski, P.C.

(57) ABSTRACT

A ternary polycrystalline material based on lead hafnate (PbHfO$_3$) and having improved dielectric, piezoelectric, and/or thermal stability properties. The Pb(Hf,Ti)O$_3$ based material can exhibit enhanced electromechanical coupling factors when compared to PZT based ceramics and can be used as high performance actuators, piezoelectric sensors and/or ultrasonic transducers. The ternary polycrystalline material can have a perovskite crystal structure with an ABO$_3$ formula and can be characterized by a substitution of heterovalent acceptor and donor ions at A or B (Zr/Hf) sites.

10 Claims, 6 Drawing Sheets

PB(HF,TI)O₃ BASED HIGH PERFORMANCE POLYCRYSTALLINE PIEZOELECTRIC MATERIALS

CROSS-REFERENCE TO RELATED APPLICATIONS

This application claims priority of U.S. Provisional Application 61/581,365, filed Dec. 29, 2011, the contents of which are incorporated herein by reference.

FIELD OF THE INVENTION

The present invention is related to a piezoelectric material, and in particular, a high performance polycrystalline piezoelectric material based on lead hafnate.

BACKGROUND OF THE INVENTION

For the past 60 years, perovskite $Pb(Zr_xTi_{1-x})O_3$ (PZT) piezoelectric ceramics have dominated the commercial market of piezoelectric sensors, actuators and medical ultrasonic transducers due to their high dielectric, piezoelectric and electromechanical coupling factor properties. In addition, the properties of PZT piezoelectric ceramics can be further modified with different additives and/or dopants. In particular, PZT piezoelectric ceramics with compositions in the vicinity of a morphotropic phase boundary (MPB) that separates a rhombohedral phase from a tetragonal ferroelectric phase can exhibit anomalously high dielectric and piezoelectric properties. The high properties are the result of enhanced polarizability from the coupling between two equivalent energy states, i.e. between a tetragonal phase and a rhombohedral phase, which allows optimum domain reorientation during poling.

Figure 1:
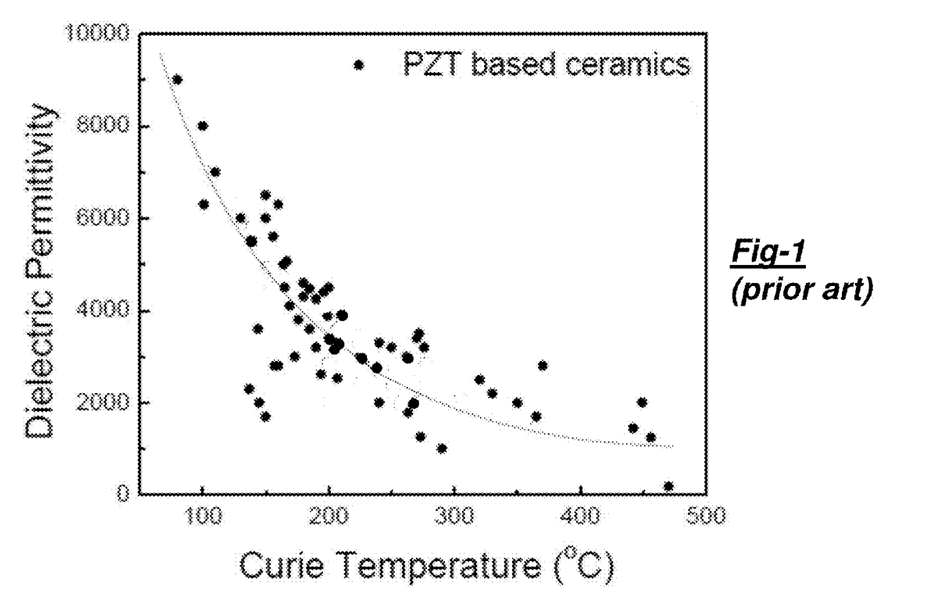
FIG. 1 is a graphical plot illustrating dielectric permittivity as a function of Curie temperature for PZT piezoelectric ceramics.
Figure 2:
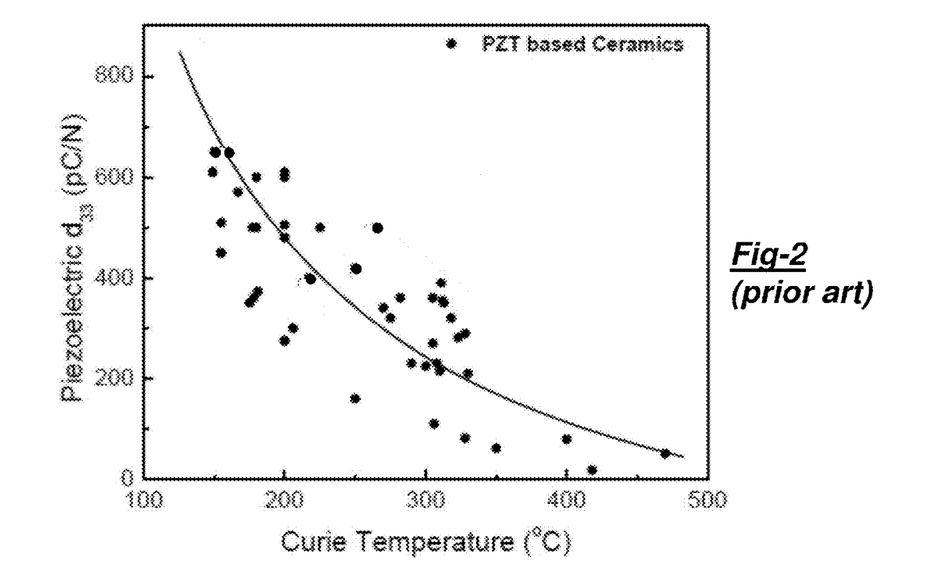
FIG. 2 is a graphical plot illustrating piezoelectric coefficient $d_{33}$ as a function of Curie temperature for PZT piezoelectric ceramics.

Numerous PZT formulations/compositions have been engineered for specific characteristics that enhance their use in many applications. For example, Tables I and II list the properties of commercially available soft PZT ceramics, and FIGS. 1 and 2 provide plots of dielectric permittivity and piezoelectric coefficient $d_{33}$ versus Curie temperature ($T_C$) for such materials. As shown by the data, polycrystalline materials with higher Curie temperatures generally possess lower dielectric and piezoelectric properties.

TABLE I

Piezoelectric, dielectric and ferroelectric properties of commercial PZT5A type ceramics.

| PZT5H | $d_{33}$ (pC/N) | $k_p$ (%) | $\epsilon_r$ | tanδ (%) | $T_C$ (° C.) | $P_r$ (μC/cm²) | $E_C$ (kV/cm) |
|---|---|---|---|---|---|---|---|
| TRS200HD[1] | 400 | 0.66 | 2000 | 1.8 | 340 | / | / |
| 3195STD[2] | 350 | 0.63 | 1800 | 1.8 | 350 | 39 | 14.9 |
| 3295HD[2] | 390 | 0.65 | 1900 | 1.8 | 350 | 39 | 12.0 |
| PIC255[3] | 400 | 0.62 | 1750 | 2.0 | 350 | / | / |
| PIC155[3] | 360 | 0.62 | 1450 | 2.0 | 345 | / | / |
| PKI502[4] | 425 | 0.60 | 2000 | 1.5 | 350 | / | / |
| PZ23[5] | 328 | 0.52 | 1500 | 1.3 | 350 | / | / |
| PZ27[5] | 425 | 0.59 | 1800 | 1.7 | 350 | / | / |
| PZT5A1[6] | 410 | 0.62 | 1875 | 2.0 | 370 | / | / |
| PZT5A3[6] | 374 | 0.60 | 1700 | 2.0 | 365 | / | / |

[1]TRS Technologies;
[2]CTS;
[3]PIceramic;
[4]Piezo-kinetics;
[5]Ferroperm;
[6]Morgan.

TABLE II

Piezoelectric, dielectric and ferroelectric properties of commercial PZT5H type ceramics.

| PZT5H | $d_{33}$ (pC/N) | $k_p$ (%) | $\epsilon_r$ | tanδ (%) | $T_C$ (° C.) | $P_r$ (μC/cm²) | $E_C$ (kV/cm) |
|---|---|---|---|---|---|---|---|
| TRS610HD[1] | 690 | 0.70 | 3900 | 1.8 | 210 | / | / |
| CTS3203STD[2] | 550 | 0.69 | 3250 | 2.0 | 235 | 37 | 10.6 |
| CTS3203HD[2] | 650 | 0.70 | 3800 | 2.0 | 225 | 39 | 8.0 |
| PIC151[3] | 500 | 0.62 | 2400 | 2.0 | 250 | / | / |
| PIC153[3] | 600 | 0.62 | 4200 | 3.0 | 185 | / | / |
| PKI532[4] | 490 | 0.63 | 2700 | 2.0 | 220 | / | / |
| PKI552[4] | 600 | 0.67 | 3400 | 2.2 | 200 | / | / |
| PZ21[5] | 640 | 0.60 | 3980 | 1.6 | 218 | / | / |
| PZ29[5] | 570 | 0.64 | 2870 | 1.6 | 235 | / | / |
| PZT5H1[6] | 620 | 0.60 | 3400 | 1.8 | 200 | / | / |
| PZT5H2[6] | 590 | 0.65 | 3400 | 2.5 | 195 | / | / |

[1]TRS Technologies;
[2]CTS;
[3]PIceramic;
[4]Piezo-kinetics;
[5]Ferroperm;
[6]Morgan.

It is appreciated that innovations in electronic devices have been the driving force for new developments in piezoelectric ceramics. In fact, and in order to meet the newly developed electromechanical devices, materials with Curie temperatures equivalent to heretofore developed materials but with higher dielectric and piezoelectric properties, and/or materials with similar dielectric and piezoelectric properties but higher Curie temperatures, are desired.

In addition to the above, the electromechanical coupling factor—the square of which is closely related to output power density—is known to be an important material parameter in ultrasonic transducer applications and the dielectric variation for prior art PZT based materials is relatively broad and on the order of 2000-8000 ppm/° C. Therefore, a new polycrystalline piezoelectric material with increased electromechanical coupling factor and reduced dielectric variation would also be desirable.

SUMMARY OF THE INVENTION

Ternary polycrystalline materials based on lead hafnate ($PbHfO_3$) and having improved dielectric, piezoelectric, and/or thermal stability properties are provided. In addition, the $PbHfO_3$ based materials can exhibit enhanced electromechanical coupling factors when compared to PZT based ceramics. The inventive materials can be used as high performance actuators, piezoelectric sensors and/or ultrasonic transducers.

In particular, the ternary polycrystalline materials provide piezoelectric ceramic materials based on lead hafnium titanate, e.g. $PbHfO_3$—$PbTiO_3$ (PHI), that have a perovskite crystal structure with an $ABO_3$ formula and are characterized by a substitution of heterovalent acceptor and donor ions at Zr/Hf sites. In addition, $Pb(M_I^{3+}{}_{1/3}, M_{II}^{5+}{}_{2/3})O_3$—PHT ternary systems are provided that have: (1) equivalent Curie temperatures as prior art PZT based ceramics but exhibit higher dielectric and piezoelectric properties when compared thereto; and/or (2) comparable dielectric and piezoelectric properties as prior art PZT based ceramics but exhibit higher Curie temperatures when compared thereto.

In some instances, the ternary polycrystalline materials have a formula of $Pb_{1-x}M_x[\{M_I^{2+}\}_{1/3}\{M_{II}^{5+}\}_{2/3}]_{1-y-z}Hf_zTi_yO_3$, where M is $Ba^{2+}$, $Ca^{2+}$, $Sr^{2+}$, $La^{3+}$ and the like; $M_I$ is $Mg^{2+}$, $Zn^{2+}$, $Ni^{2+}$ and the like; $M_{II}$ is $Nb^{5+}$, $Ta^{5+}$, $Sb^{5+}$ and the like; x is greater than or equal to 0.0 and less than 0.2; y is greater than 0.3 and less than 0.7, in some instances greater than 0.2 and less than 0.8; and z is greater than 0.3 and less than 0.7, in some instances greater than 0.2 and less than 0.8. In other instances, the ternary piezoelectric polycrystalline material has a formula of $Pb_{1-x}M_x$ [$\{M_I^{3+}\}_{1/2}$ $\{M_{II}^{5+}\}_{1/2}]_{1-y-z}Hf_zTi_yO_3$, where $M_I^{3+}$ is $Yb^{3+}$, $Sc^{3+}$, $In^{3+}$ and $Hf^{4+}$ or $Ti^{4+}$ ions are at least partially replaced with donor dopants or acceptor dopants. The donor dopants can be $Nb^{5+}$, $Ta^{5+}$, $W^{5+}$ and the like and the acceptor dopants can be $Fe^{2+,3+}$, $Co^{2+,3+}$, $Mn^{2+,3+}$ and the like. In addition, M is $Ba^{2+}$, $Ca^{2+}$, $Sr^{2+}$, $La^{3+}$ and the like; $M_{II}$ is $Nb^{5+}$, $Ta^{5+}$, $Sb^{5+}$ and the like; x is greater than or equal to 0.0 and less than 0.2; y is greater than 0.3 and less than 0.7, in some instances greater than 0.2 and less than 0.8; and z is greater than 0.3 and less than 0.7, in some instances greater than 0.2 and less than 0.8.

The inventive material can have a Curie temperature in the range of 180° C. to 280° C. and a piezoelectric coefficient $d_{33}$ greater than 600 pC/N, a Curie temperature of greater than 300° C. and a piezoelectric coefficient $d_{33}$ greater than 500 pC/N, a Curie temperature in the range of 260-300° C. and a piezoelectric coefficient $d_{33}$ in the range of 450-680 pC/N, and/or a Curie temperature greater than 120° C. and a piezoelectric coefficient $d_{33}$ greater than 800 pC/N. In addition, the material can have electromechanical coupling $k_{33}$ within a range of about 0.707-0.775.

DETAILED DESCRIPTION OF THE INVENTION

Inventive lead hafnium titanate-lead magnesium niobate (PHT-PMN) ternary ceramics with compositions of $(1-x)Pb(Hf_{1-y}Ti_y)O_3$-xPb(Mg$_{1/3}$Nb$_{2/3}$)O_3$ $((1-x)Pb(Hf_{1-y}Ti_y)$ $O_3$-xPMN, x=0~0.5, y=0.515~0.7) are provided. For example and for illustrative purposes only, an example of how typical PHT-PMN ternary ceramics according to one or more embodiments of the present invention were produced and associated properties are described below.

The inventive materials were prepared using a two-step precursor method. Raw materials of MgCO$_3$ (99.9%, Alfa Aesar, Ward Hill, Mass.), Nb$_2$O$_5$ (99.9%, Alfa Aesar), HfO$_2$ (99.9%, Alfa Aesar) and TiO$_2$ (99.9%, Ishihara, San Francisco, Calif.) were used to synthesize columbite precursors of MgNb$_2$O$_6$ and Hf$_{0.45}$Ti$_{0.55}$O$_2$ at 1000° C. and 1200° C., respectively. Thereafter, Pb$_3$O$_4$ (99%, Alfa Aesar) and the MgNb$_2$O$_6$ and Hf$_{0.45}$Ti$_{0.55}$O$_2$ percursor powders were batched stoichiometrically by wet-milling in alcohol for 24 hours (h). Dried mixed powders of the Pb$_3$O$_4$, MgNb$_2$O$_6$ and Hf$_{0.45}$Ti$_{0.55}$O$_2$ were then calcined at 800° C. for 4 h to produce synthesized powders which were subsequently vibratory milled in alcohol for 12 h. The synthesized powders were then granulated and pressed into pellets having a 12 mm diameter, followed by a binder burnout at 550° C. and sintering in a sealed crucible at 1250° C. In order to minimize PbO evaporation during sintering, PbZrO$_3$ was used as a lead (Pb) source in the sealed crucible.

Figure 3:
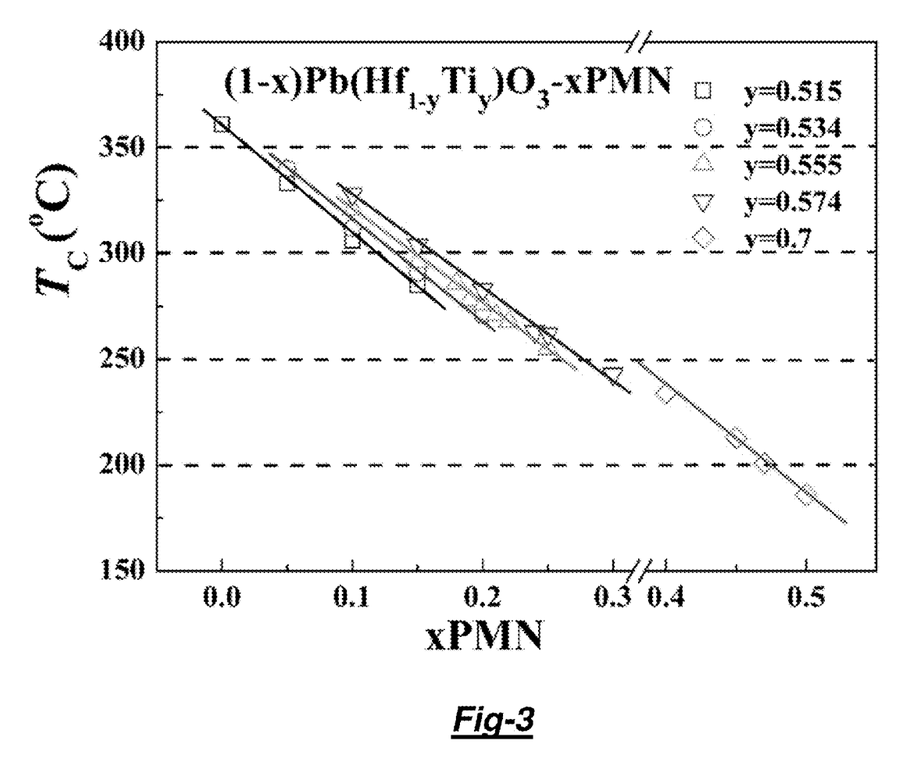
FIG. 3 is a graphical plot illustrating Curie temperature versus amount of PMN for pellets having a composition formula of $(1-x)Pb(Hf_{1-y}Ti_y)O_3$-xPMN with various levels of lead titanate (PT)

Sintered pellets were tested for temperature dependence of dielectric permittivity with FIG. 3 illustrating Curie temperature ($T_C$) versus amount of PMN for pellets having a composition formula of $(1-x)Pb(Hf_{1-y}Ti_y)O_3$-xPMN with various levels of lead titanate (PT). As shown in the figure, increasing the PMN content resulted in a monotonic $T_C$ decrease from 360-285° C., 340-270° C., 320-255° C., 328-243° C. and 234-186° C. for the different PT levels corresponding to y=0.515, 0.534, 0.555, 0.574 and 0.7, respectively. Furthermore, with increasing PMN content, the ternary solid solution exhibited more relaxor-like characteristics, showing broadened dielectric peaks and dispersive dielectric behavior with respect to frequency.

Figure 4:
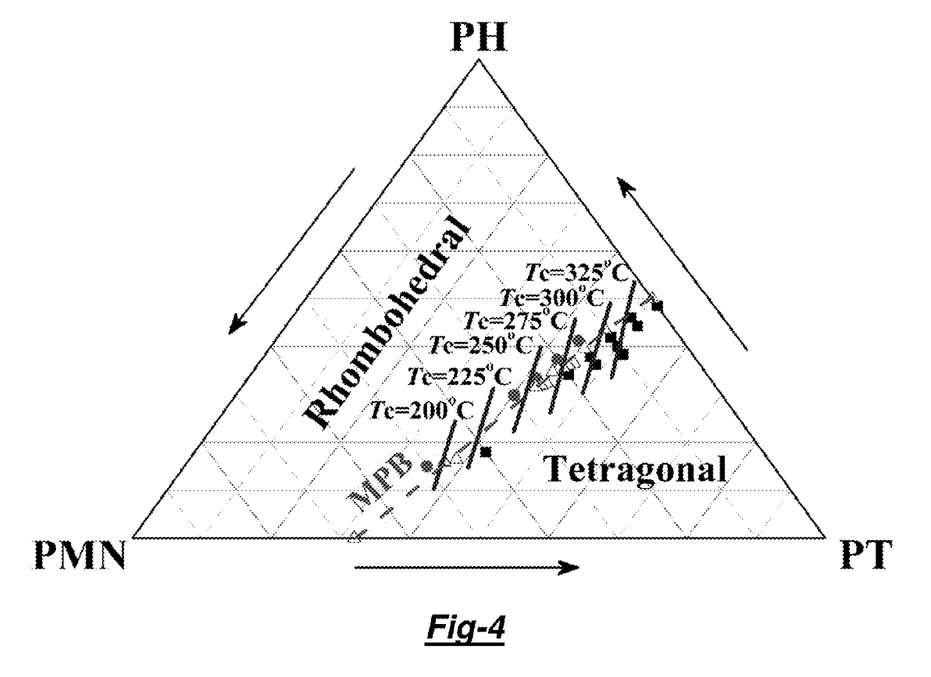
FIG. 4 is an isothermal map of Currie temperature ($T_C$) for $(1-x)Pb(Hf_{1-y}Ti_y)O_3$-xPMN.

Based on the above results, an isothermal map of Currie temperature ($T_C$) for $(1-x)Pb(Hf_{1-y}Ti_y)O_3$-xPMN was developed and is shown in FIG. 4. It is appreciated that along the MPB line from the PH-PT side towards the PMN-PT side, $T_C$ gradually decreases from 325° C. to 200° C. It is appreciated that this decrease in $T_C$ could be due to an increase of PMN content in the sintered pellets that were tested.

Figure 5:
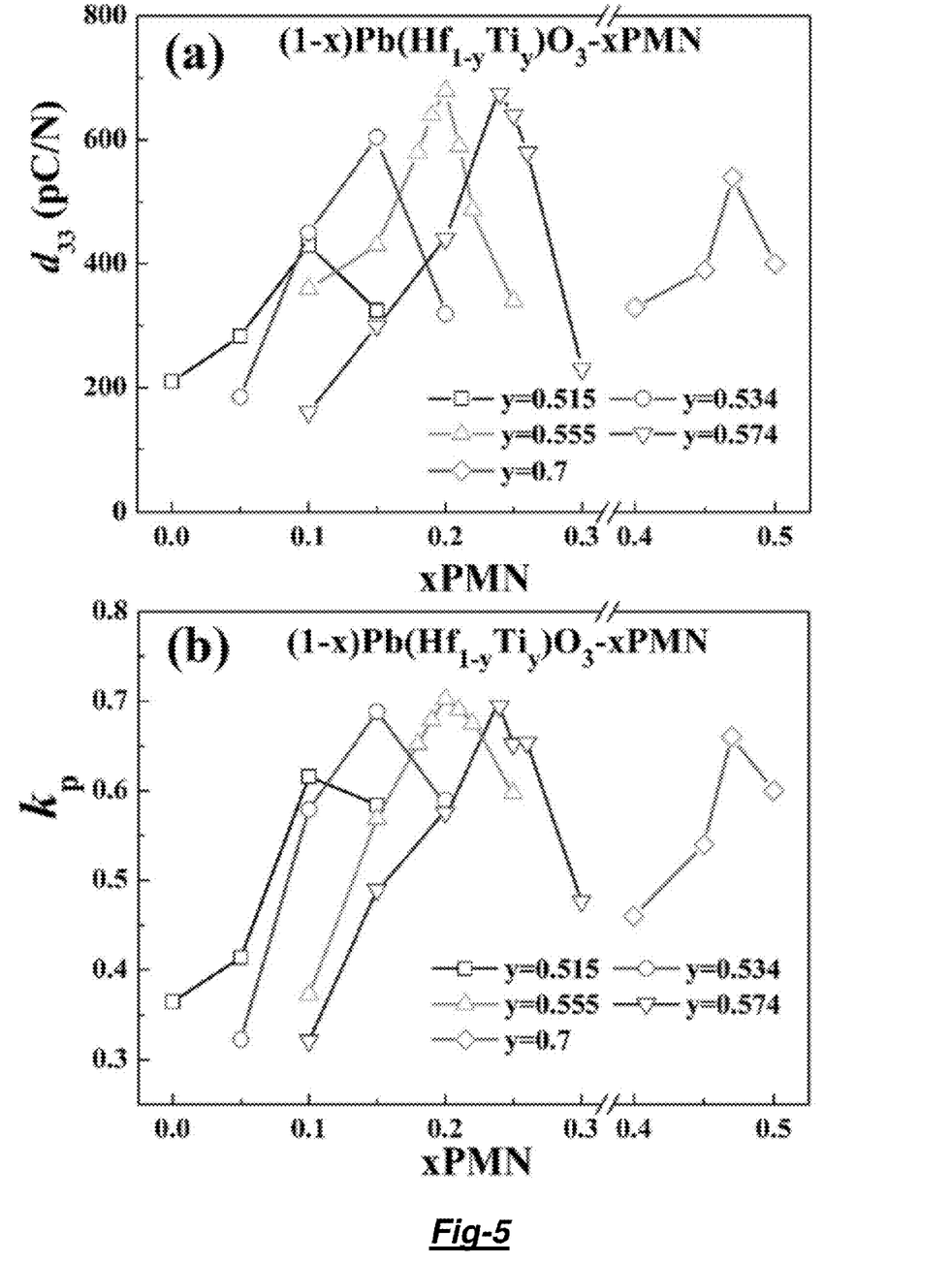
FIG. 5a is a graphical plot illustrating piezoelectric coefficient $d_{33}$ as a function of PMN content.
FIG. 5b is a graphical plot illustrating planar electrochemical coupling $k_p$ as a function of PMN content.

The dielectric, piezoelectric and electromechanical properties of all studied $(1-x)Pb(Hf_{1-y}Ti_y)O_3$-xPMN compositions are summarized in Table III. In addition, the piezoelectric coefficient $d_{33}$ and planar electromechanical coupling $k_p$ as a function of PMN are shown in FIGS. 5a and 5b, respectively. As shown in the figures, optimum piezoelectric and electromechanical properties where exhibited for specific compositions and it is appreciated that the optimum properties could be due to enhanced polarizability arising from coupling between tetragonal and rhombohedral phases. In addition, the optimum piezoelectric and electromechanical properties were achieved for the composition 0.8Pb(Hf$_{0.445}$Ti$_{0.555}$)O$_3$-0.2Pb(Mg$_{1/3}$Nb$_{2/3}$)O$_3$, with dielectric permittivity $\in_r$, piezoelectric coefficient $d_{33}$, planar electromechanical coupling $k_p$ and $T_C$ being on the order of 2870, 680 pC/N, 70% and 276° C., respectively.

TABLE III

Piezoelectric, dielectric and ferroelectric properties of $(1-x)Pb(Hf_{1-y},Ti_y)O_3$-$x$PMN ternary ceramics.

| $(1-x)Pb(Hf_{1-y},Ti_y)O_3$-$x$PMN | | $d_{33}$ (pC/N) | $k_p$ (%) | $\epsilon_r$ | tan$\delta$ (%) | $T_C$ (°C.) | $P_r$ (μC/cm$^2$) | $E_C$ (kV/cm) |
|---|---|---|---|---|---|---|---|---|
| y = 0.515 | x = 0 | 210 | 37 | 1220 | 1.1 | 360 | 13 | 13.2 |
| | x = 0.05 | 280 | 41 | 1560 | 1.6 | 333 | 25 | 11.9 |
| | x = 0.1 | 430 | 62 | 1100 | 2.1 | 306 | 37 | 8.8 |
| | x = 0.15 | 330 | 58 | 870 | 2.4 | 285 | 39 | 8.3 |
| y = 0.534 | x = 0.05 | 190 | 32 | 1350 | 1.4 | 340 | 18 | 14.4 |
| | x = 0.1 | 450 | 58 | 2030 | 1.4 | 312 | 32 | 15 |
| | x = 0.15 | 600 | 69 | 2330 | 1.9 | 291 | 40 | 9.4 |
| | x = 0.2 | 320 | 59 | 960 | 2.2 | 271 | 36 | 8.1 |
| y = 0.555 | x = 0.1 | 360 | 37 | 1300 | 1.4 | 321 | 23 | 17.3 |
| | x = 0.15 | 430 | 57 | 2120 | 1.4 | 296 | 32 | 15.2 |
| | x = 0.18 | 580 | 65 | 2770 | 1.5 | 286 | 37 | 11.3 |
| | x = 0.19 | 640 | 68 | 2810 | 1.5 | 278 | 40 | 10.3 |
| | x = 0.2 | 680 | 70 | 2870 | 1.7 | 276 | 40 | 9.9 |
| | x = 0.21 | 590 | 69 | 2040 | 1.6 | 271 | 42 | 9.3 |
| | x = 0.22 | 490 | 68 | 1630 | 1.8 | 268 | 40 | 8.4 |
| | x = 0.25 | 340 | 60 | 1020 | 2.2 | 255 | 38 | 7.9 |
| y = 0.574 | x = 0.1 | 160 | 32 | 1050 | 1.3 | 328 | 22 | 19.9 |
| | x = 0.15 | 300 | 49 | 1550 | 1.2 | 304 | 31 | 19.4 |
| | x = 0.2 | 440 | 58 | 2360 | 1.4 | 283 | 34 | 13.3 |
| | x = 0.24 | 670 | 69 | 2960 | 1.4 | 263 | 41 | 9.5 |
| | x = 0.25 | 640 | 65 | 2470 | 1.6 | 262 | 38 | 9.3 |
| | x = 0.26 | 580 | 65 | 1900 | 1.6 | / | 41 | 8.6 |
| | x = 0.3 | 230 | 48 | 1120 | 2.2 | 243 | 28 | 7.1 |
| y = 0.7 | x = 0.4 | 330 | 46 | 2360 | 0.8 | 234 | 26 | 10.7 |
| | x = 0.45 | 390 | 54 | 2050 | 1.1 | 213 | 30 | 7.3 |
| | x = 0.47 | 540 | 66 | 2090 | 1.3 | 201 | 37 | 7 |
| | x = 0.5 | 400 | 60 | 1420 | 1.8 | 186 | 36 | 5.9 |

The main properties of other systems, such as $(1-x)Pb(Hf_{1-y},Ti_y)O_3$-$x$Pb$(Ni_{1/3}Nb_{2/3})O_3$ (PHT-PNN), $(1-x)Pb(Hf_{1-y},Ti_y)O_3$-$x$Pb$(Sc_{0.5}Nb_{0.5})O_3$ (PHT-PSN) and $(1-x)Pb(Hf_{1-y},Ti_y)O_3$-$x$Pb$(Zn_{1/3}Nb_{2/3})O_3$ (PHT-PZN), are given in Tables IV and V below, respectively.

TABLE IV

Piezoelectric, dielectric and ferroelectric properties of $(1-x)Pb(Hf_{1-y},Ti_y)O_3$-$x$PNN ternary ceramics.

| Samples | | $d_{33}$ (pC/N) | $k_p$ (%) | K | loss (%) | $T_C$ (°C.) | Pr (μC/cm$^2$) | $E_c$ (kV/cm) |
|---|---|---|---|---|---|---|---|---|
| y = 0.55 | x = 5 | 160 | 35 | 1050 | 1.0 | 337 | 10 | 12 |
| | 10 | 280 | 43 | 1400 | 1.2 | 310 | 16 | 12 |
| | 15 | 340 | 49 | 1830 | 1.8 | 280 | 24 | 10.7 |
| | 18 | 495 | 61 | 2140 | 1.7 | 260 | 29 | 8 |
| | 19 | 470 | 61 | 1970 | 1.6 | 256 | 28 | 7.5 |
| | 20 | 435 | 61 | 1870 | 1.8 | 250 | 31 | 7.5 |
| | 22 | 380 | 60 | 1250 | 1.7 | 238 | 34 | 7.3 |
| | 25 | 350 | 60 | 1180 | 1.8 | 222 | 36 | 7.2 |
| y = 0.57 | x = 10 | 170 | | 1030 | 1.1 | — | | |
| | 15 | 250 | 39 | 1280 | 1.4 | 292 | 19 | 13.7 |
| | 19 | 350 | 47 | 1950 | 1.5 | 266 | 21 | 10.2 |
| | 20 | 360 | 49 | 2000 | 1.5 | 257 | 23 | 10.2 |
| | 21 | 420 | 57 | 2100 | 1.55 | 252 | 27 | 9.8 |
| | 22 | 480 | 57 | 2600 | 1.77 | 246 | 28 | 9 |
| | 23 | 550 | 65 | 2650 | 1.8 | 240 | 32 | 8.8 |
| | 25 | 595 | 66 | 2200 | 1.66 | 229 | 34 | 7.6 |
| | 20 | 320 | 50 | 2000 | 1.2 | 260 | 24 | 11.5 |
| | 22 | 410 | 54 | 2390 | 1.3 | 250 | 28 | 10.1 |
| | 23 | 460 | 57 | 2600 | 1.38 | 244 | 29 | 9.8 |
| | 24 | 530 | 61 | 2850 | 1.4 | 235 | 31 | 9.4 |
| | 25 | 610 | 65 | 3000 | 1.5 | 234 | 33 | 8.6 |
| | 26 | 650 | 68 | 2950 | 1.6 | 227 | 35 | 8.5 |
| | 26.5 | 630 | 67 | 2430 | 1.5 | 225 | 35 | 8.4 |
| | 27 | 660 | 68 | 2200 | 1.35 | 221 | 37 | 7.5 |
| | 28 | 530 | 65 | 2270 | 1.5 | 215 | 36 | 7 |
| | 30 | 460 | 64 | 2000 | 1.7 | 204 | 36 | 6.4 |
| y = 0.60 | x = 25 | 570 | 63 | 3200 | 1.46 | 225 | 29 | 9.5 |
| | 28 | 650 | 67 | 3450 | 1.5 | 220 | 31 | 9 |
| | 29 | 700 | 69 | 3610 | 1.7 | 214 | 32 | 8.3 |

TABLE IV-continued

Piezoelectric, dielectric and ferroelectric properties of $(1-x)Pb(Hf_{1-y}Ti_y)O_3$-$x$PNN ternary ceramics.

| Samples | | $d_{33}$ (pC/N) | $k_p$ (%) | K | loss (%) | $T_C$ (°C.) | Pr ($\mu$C/cm$^2$) | $E_c$ (kV/cm) |
|---|---|---|---|---|---|---|---|---|
| | 30 | 765 | 70 | 3800 | 2.0 | 210 | 32 | 7.4 |
| | 30.5 | 795 | 71 | 3600 | 2.0 | 206 | 33 | 7.2 |
| | 31 | 760 | 71 | 3250 | 2.0 | 203 | 34 | 7.2 |
| | 31.5 | 730 | 71 | 2940 | 1.8 | — | 35 | 6.9 |
| | 32 | 690 | 70 | 2880 | 1.75 | 199 | 34 | 6.6 |
| | 33 | 640 | 68 | 2350 | 1.75 | 191 | 34 | 6.2 |
| y = 0.70  x = | 30 | 300 | 47 | 1900 | 1.4 | 208 | 25 | 12.5 |
| | 40 | 445 | 51 | 2700 | 1.3 | 184 | 26 | 9 |
| | 42 | 540 | 55 | 3600 | 1.65 | 168 | 26 | 6 |
| | 44 | 650 | 58 | 4500 | 1.85 | 155 | 26 | 6.7 |
| | 45 | 725 | 60 | 4950 | 1.98 | 151 | 26 | 6.5 |
| | 46 | 800 | 61 | 5500 | 1.8 | 145 | 27 | 5.6 |
| | 47 | 865 | 63 | 5830 | 2.3 | 138 | 27 | 5.1 |
| | 48 | 940 | 65 | 5240 | 2.4 | 120 | 27 | 3.8 |
| | 49 | 970 | 65 | 6000 | 2.5 | — | 27 | 4.2 |
| | 50 | 930 | 65 | 5930 | 2.38 | — | 27 | 4.3 |

TABLE V

Piezoelectric, dielectric and ferroelectric properties of $(1-x)Pb(Hf_{1-y}Ti_y)O_3$-$x$PSN and $(1-x)Pb(Hf_{1-y}Ti_y)O_3$-$x$PZN ternary ceramics.

| Materials | | $d_{33}$ | $k_p$ | K | loss | $T_C$ | Pr | $E_c$ |
|---|---|---|---|---|---|---|---|---|
| y | x | (pC/N) | (%) | | (%) | (°C.) | ($\mu$C/cm$^2$) | (kV/cm) |
| $(1-x)Pb(Hf_{1-y}Ti_y)O_3$-$x$PSN | | | | | | | | |
| 0.60 | 0.20 | 550 | 65 | 2420 | 1.5 | 325 | 38 | 10.6 |
| 0.575 | 0.175 | 600 | 71 | 2220 | 1.6 | 325 | 43 | 9.4 |
| 0.55 | 0.12 | 590 | 70 | 2250 | 1.6 | 334 | 43 | 9.5 |
| 0.55 | 0.125 | 560 | 67 | 1950 | 1.7 | 330 | 41 | 9.2 |
| $(1-x)Pb(Hf_{1-y}Ti_y)O_3$-$x$PZN | | | | | | | | |
| 0.519 | 0.20 | 500 | 70 | 1650 | 2.0 | 292 | 42 | 9.1 |
| 0.525 | 0.20 | 530 | 69 | 2060 | 2.0 | 295 | 41 | 10.3 |
| 0.525 | 0.25 | 510 | 68 | 1900 | 2.0 | 280 | 41 | 9.9 |
| 0.539 | 0.225 | 570 | 68 | 2300 | 2.0 | 292 | 38 | 11.6 |

Figure 6:
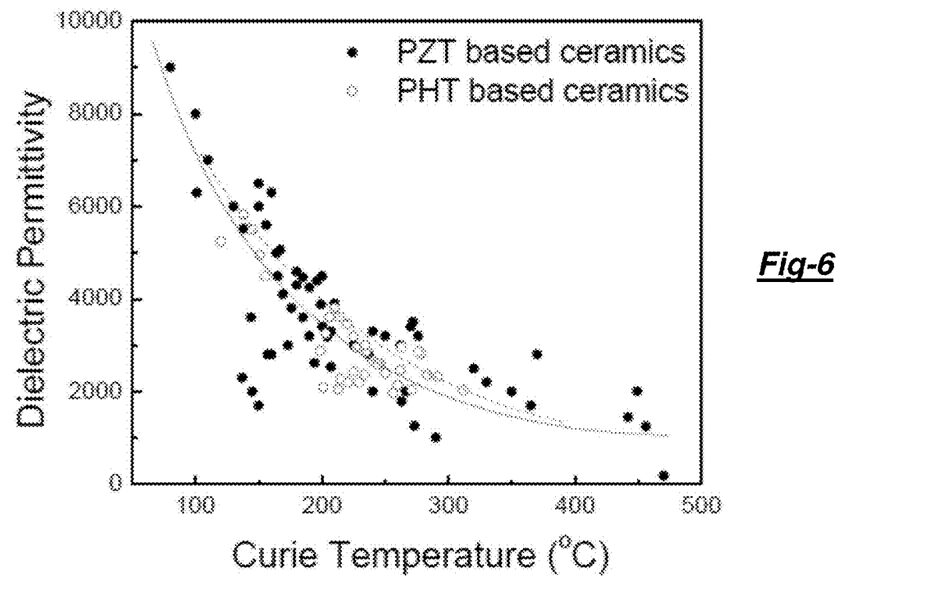
FIG. 6 is a graphical plot with data from the inventive materials shown in Tables III-V superimposed on data shown in FIG. 1.
Figure 7:
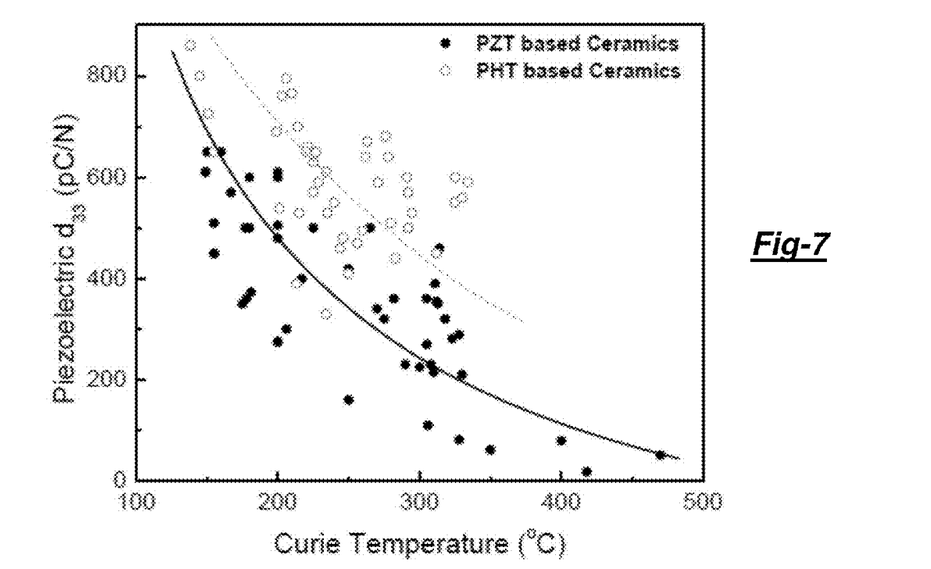
FIG. 7 is a graphical plot with data from the inventive materials shown in Tables III-V superimposed on data shown in FIG. 2.
Figure 8:
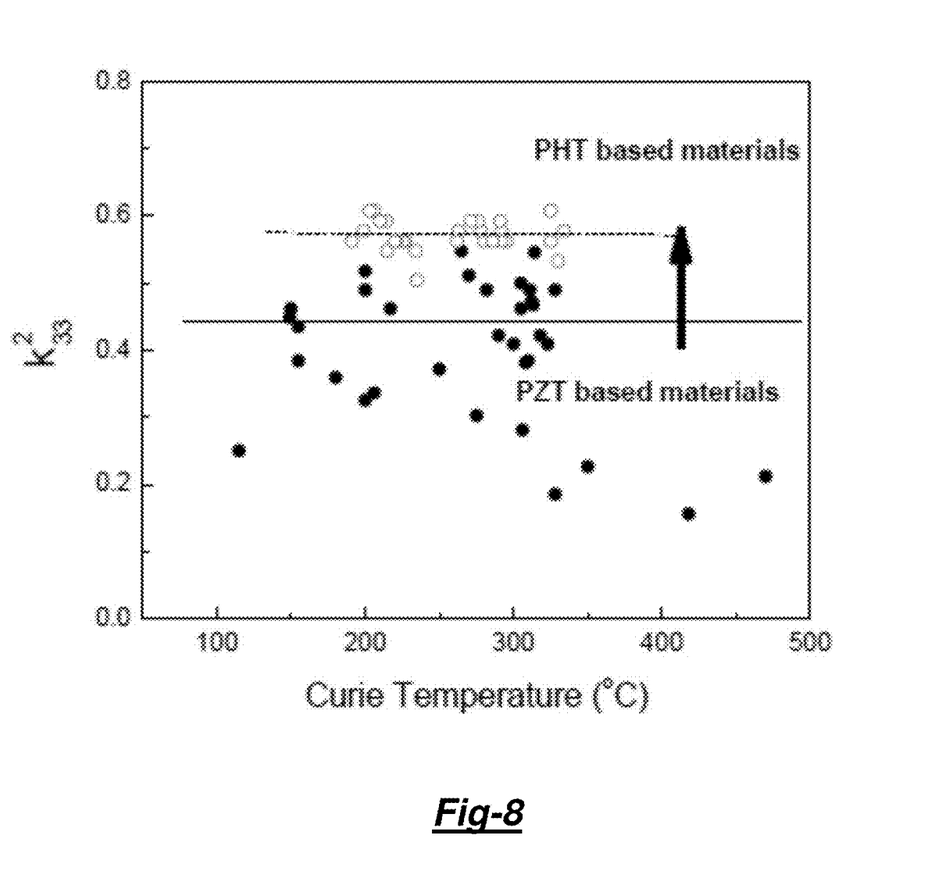
FIG. 8 is a graphical plot of electromechanical coupling factor squared ($k_{33}^2$) as a function of Currie temperature for prior art PZT based ceramics and the inventive PHT based ceramics disclosed herein.

In order to provide a clearer view of the enhanced properties exhibited by the inventive materials, FIGS. 6 and 7 are plots of data from Tables III-V above compared to the data shown in FIGS. 1 and 2. The data from Tables III-V are labeled as PHT based ceramics, versus the data from FIGS. 1 and 2 which are labeled as PZT based ceramics. As shown in the figures, a comparable dielectric permittivity with significant higher $d_{33}$ coefficient is exhibited by the inventive materials compared to heretofore polycrystalline piezoelectric materials. In addition, FIG. 8 provides a plot of the electromechanical coupling factor squared ($k_{33}^2$) as a function of $T_C$ for prior art PZT based ceramics and the inventive PHT based ceramics. Again, a significant improvement in output power density is expected by the ternary PHT polycrystalline piezoelectric materials disclosed herein.

The invention is not restricted to the illustrative examples and embodiments described above. The examples are not intended as limitations on the scope of the invention. Methods, apparatus, compositions, and the like described herein are exemplary and not intended as limitations on the scope of the invention. Changes therein and others will occur to those skilled in the art and, as such, the specification and the appendices should be interpreted broadly.

We claim:

1. A ternary piezoelectric polycrystalline material comprising:
a lead hafnium titanate containing ceramic having a formula of $Pb_{1-x}M_x[\{M_I^{2+}\}_{1/3}\{M_{II}^{5+}\}_{2/3}]_{1-y-z}Hf_zTi_yO_3$, where:
M is at least one of $Ba^{2+}$, $Ca^{2+}$, $Sr^{2+}$ and $La^{3+}$;
$M_I^{2+}$ is at least one of $Mg^{2+}$, $Ni^{2+}$ and $Zn^{2+}$;
$M_{II}^{5+}$ is at least one of $Nb^{5+}$, $Sb^{5+}$ and $Ta^{5+}$;
x is greater than 0.0 and less than 0.2;
y is greater than 0.2 and less than 0.8; and
z is greater than 0.2 and less than 0.8.

2. The composition of claim 1, wherein said lead hafnium titanate containing ceramic has a Curie temperature in the range of 180° C. to 280° C. and a piezoelectric coefficient $d_{33}$ greater than 600 pC/N.

3. The composition of claim 1, wherein said lead hafnium titanate containing ceramic has a Curie temperature of greater than 300° C., a piezoelectric coefficient $d_{33}$ greater than 500 pC/N and electromechanical coupling $k_{33}$ within a range of 0.707 to 0.775.

4. The composition of claim 1, wherein said lead hafnium titanate containing ceramic has a Curie temperature in the range of 260-300° C. and a piezoelectric coefficient $d_{33}$ in the range of 450-680 pC/N.

5. The composition of claim 1, wherein said lead hafnium titanate containing ceramic has a Curie temperature greater than 120° C. and a piezoelectric coefficient $d_{33}$ greater than 800 pC/N.

6. A ternary piezoelectric polycrystalline material comprising:
a lead hafnium titanate containing ceramic having a formula of $Pb_{1-x}M_x[\{M_I^{3+}\}_{1/3}\{M_{II}^{5+}\}_{2/3}]_{1-y-z}Hf_zTi_yO_3$ where:
M is at least one of $Ba^{2+}$, $Ca^{2+}$, $Sr^{2+}$ and $La^{3+}$;
$M_I^{3+}$ is at least one of $Yb^{3+}$, $Sc^{3+}$, $In^{3+}$, $Fe^{3+}$ and $Co^{3+}$;
$M_{II}^{5+}$ is at least one of $Nb^{5+}$, $Sb^{5+}$ and $Ta^{5+}$;
X is greater than 0.0 and less than 0.2;
y is greater than 0.2 and less than 0.8;
z is greater than 0.2 and less than 0.8; and
$Hf^{4+}$ or $Ti^{4+}$ ions are at least partially replaced with donor dopants or acceptor dopants;
said donor dopants being at least one of $Nb^{5+}$, $Ta^{5+}$ and $W^{5+}$; and said acceptor dopants being at least one of $Fe^{2+}$, $Co^{2\alpha,3+}$, $Co^{2+,3+}$, $Mn^{2+,3+}$, $Cu^{+,2+}$.

7. The composition of claim 6, wherein said lead hafnium titanate containing ceramic has a Curie temperature in the range of 180° C. to 280° C. and a piezoelectric coefficient $d_{33}$ greater than 600 pC/N.

8. The composition of claim 6, wherein said lead hafnium titanate containing ceramic has a Curie temperature of greater than 300° C., a piezoelectric coefficient $d_{33}$ greater than 500 pC/N and electromechanical coupling $k_{33}$ within a range of 0.707-0.775.

9. The composition of claim 6, wherein said lead hafnium titanate containing ceramic has a Curie temperature in the range of 260-300° C. and a piezoelectric coefficient $d_{33}$ in the range of 450-680 pC/N.

10. The composition of claim 6, wherein said lead hafnium titanate containing ceramic has a Curie temperature greater than 120° C. and a piezoelectric coefficient $d_{33}$ greater than 800 pC/N.

\* \* \* \* \*